(12) United States Patent
Gnadinger et al.

(10) Patent No.: US 6,268,796 B1
(45) Date of Patent: Jul. 31, 2001

(54) RADIO FREQUENCY IDENTIFICATION TRANSPONDER HAVING INTEGRATED ANTENNA

(76) Inventors: Alfred Gnadinger, 19 Leaming Rd., Colorado Springs, CO (US) 80906; Stefan Linder, Biforgstrasse 12, Zofingen (CH)

( * ) Notice: Subject to any disclaimer, the term of this patent is extended or adjusted under 35 U.S.C. 154(b) by 0 days.

(21) Appl. No.: 08/989,255
(22) Filed: Dec. 12, 1997
(51) Int. Cl.[7] .................................................. G08B 13/14
(52) U.S. Cl. ................... 340/572.5; 257/673; 340/572.7
(58) Field of Search ........................... 340/572.5, 572.7, 340/572.1; 343/741, 866; 428/901; 29/600, 601, 602.1; 257/673

(56) References Cited

U.S. PATENT DOCUMENTS

| 4,857,893 | * | 8/1989 | Carroll | 340/572 |
| 5,528,222 | * | 6/1996 | Moskowitz et al. | 340/572 |
| 5,682,143 | * | 10/1997 | Brady et al. | 340/572 |
| 5,710,458 | * | 1/1998 | Iwasaki | 257/679 |
| 5,841,350 | * | 11/1998 | Appalucci et al. | 340/572 |
| 6,018,299 | * | 1/2000 | Eberhardt | 340/572.7 |

\* cited by examiner

Primary Examiner—Thomas Mullen
(74) Attorney, Agent, or Firm—Gibson, Dunn & Crutcher LLP

(57) ABSTRACT

A radio frequency identification device (RFID) has an antenna formed on a chip. The chip has backside and a front side coated with conductive traces, which are connected through conductive traces on the sides of two elongate through-hole slots formed on the chip to form an operative coil having the chip as a core. In one embodiment, the antenna chip may be stacked above an integrated circuit. In another embodiment, the integrated circuit may be formed on the antenna chip. The antenna chip may include a high magnetic permeability layer to increase the inductance of the coil, a capacitor to tune the coil to a desired frequency, and a coupling capacitor to power the integrated circuit. As well as the specific application disclosed, an inductance useful in numerous applications can be formed according to the above structure.

29 Claims, 5 Drawing Sheets

RADIO FREQUENCY IDENTIFICATION TRANSPONDER HAVING INTEGRATED ANTENNA

FIELD OF THE INVENTION

Without limiting the application of the invention as claimed, the present invention relates to the field of radio frequency identification devices (RFID). More particularly, the invention relates to an improved antenna useful in a passive RFID transponder, of the type where a device is placed on or within an article to be detected, and an external reader detects the device via electromagnetic interaction. Operative power is usually supplied by an electromagnetic field generated by the reader.

BACKGROUND

It is useful in a variety of instances to detect the location of an article. One way to do so is to place an identification device on or within the article, and sense the location of the identification device by its interaction with an electromagnetic field generated by a reader device. Appropriate electrical and/or mechanical devices engaged with the identification device and/or reader can then accomplish a desired task. As an example, an identification device can be attached to a garment or other article for retail sale for the purpose of activating an alarm if the article is improperly removed from a retail store. As another example, an animal may be tagged with such a device so that its movement into or out of a given area can be monitored. As another example, a vehicle key could be provided with such a device so that the vehicle unlocks as the key bearer approaches the vehicle. In general, the identification device is not only used for detection per se, but also to read information from and write information to the reader device. As another example of an application that may be particularly useful for the present invention, an identification device could be placed into a branded good to ensure the genuineness of the good as is passes through trade channels (i.e., prevention of counterfeit goods). A reader device at a retail location could ensure that tendered goods are genuine by reading an encrypted code stored within an identification device.

The ability of the identification device to store and manipulate information, and transmit the information to the reader device, greatly enhances the potential applications. The present invention may have application to relatively large goods, such as articles of clothing, and also to relatively small goods, such as watches or jewelry. RFID has many other uses and it is expected that still more uses will be developed. It is important for the development of the technology that RFID devices be manufactured inexpensively, and still maintain good performance characteristics.

An RFID device can be considered to have two primary components: an antenna and an integrated circuit (IC). The IC includes circuitry to interface with the antenna, encoder and decoder logic circuitry, signal processing circuitry, memory, and possibly other functions. The memory is generally nonvolatile memory, e.g., flash memory or ferroelectric memory. The memory is usually of small size, such as several hundred bits, although any size memory could theoretically be used.

The IC usually includes a coupling capacitor for transmitting energy from the electromagnetic field generated by the reader to the IC (this capacitor may also be referred to as a storage capacitor). The antenna, commonly a coil type, interacts with the electromagnetic field and is electrically interconnected with the IC. Generally, the antenna is tuned to the frequency of the reader device with which the antenna is intended to be used. Typical frequencies are 125 kHz or 13.56 MHZ. A tuning capacitor is used to provide an identification device oscillation frequency corresponding to the reader frequency. Typical capacitance values are on the order of picofarads or nanofarads.

Since IC and coil technologies are generally unrelated to one another, there has been no way to efficiently manufacture and attach the two components. A standard prior art RFID device as shown in FIG. 1 comprises an IC chip 2, a coil (antenna) 4, and connections (electrical wiring) 6 therebetween. The chip 2 generally has a coupling capacitor 8 formed thereon. While IC manufacturing techniques are quite efficient, the additional steps of manufacturing the coil and connecting it the IC chip fails to exploit these efficient manufacturing techniques. More specifically, IC's are generally manufactured using batch processing techniques, wherein numerous devices are formed simultaneously by following defined procedural steps. Other manufacturing techniques generally require components to be formed one at a time, which is both more expensive and less reliable than batch processing. An aspect of the present invention is the fabrication of an RFID device antenna through batch processing.

Attempts have been made to form a one chip RFID device by integrating the coil and the chip (a "Coil on Chip" or COC). See Glasser, "A Magnetic Power and Communication Interface for a CMOS IC", IEEE J. of SSC, Vol. 24, No. 4, August 1989. Such a COC is not believed to have been commercially successful. Similar devices are described in U.S. Pat. Nos. 4,724,427, 4,857,893, and 5,070,317. The primary antenna performance measures are inductance (L), and a Quality factor (Q) which is a ratio of reactance to resistance. The known COCs have provided unsatisfactory low inductance L and poor Q.

Wafer stacking technology has been developed by the instant inventor and others that allows for a number of wafers to be stacked above one another and electrically interconnected to form an operative unit. See U.S. Pat. No. 5,229,647. Such patent describes wafer stacking techniques of general applicability, but does not suggest adapting wafer stacking techniques to form an operative antenna or otherwise adapting wafer stacking techniques to the unique problems of fabricating simple, economical, and reliable RFID devices. It is a general purpose of the present invention to provide such an RFID device.

Each of the documents referred to herein are hereby incorporated by reference to the extent they include information helpful to a proper understanding of the present invention; the file wrappers of any patent documents are also incorporated by reference. It should be understood that no documents or descriptions herein are admitted to be "prior art," but are only mentioned to place the invention in context and to assist in a proper understanding of the invention.

SUMMARY

The present invention is directed towards the field of RFID devices. In one embodiment an RFID device has an antenna chip having a chip core, a chip front side, a chip backside, and conductive traces on the chip front side and chip backside. At least some of the traces on the chip front side are in electrical communication with at least some of the traces on the chip backside so that the conductive traces form an operative coil around the chip core. The device further includes an integrated circuit chip having an integrated circuit formed thereon; the integrated circuit has at least one of electronic memory and logic and is in electrical communication with the coil. The integrated circuit chip is stacked in relation to the antenna chip and is mechanically attached thereto, and is in electrical communication with the coil. Such embodiment is a two chip solution.

In another embodiment, an RFID device includes an RFID chip having a chip core, a chip front side, a chip backside, and conductive traces on the chip front side and chip backside. Some of the traces on the chip front side are in electrical contact with some the traces on the chip backside so that the conductive traces and form a coil around the chip core. An integrated circuit is formed on the chip front side, the integrated circuit having at least one of electronic memory and logic. The integrated circuit is in electrical communication with the coil. Such an embodiment is a one chip solution.

More generally, the present invention is useful for forming an inductance for use in electronic circuits.

Further embodiments of the invention are described more fully below, in connection with the appended drawings.

DETAILED DESCRIPTION
Two Chip Solution and Overview

Figure 1:
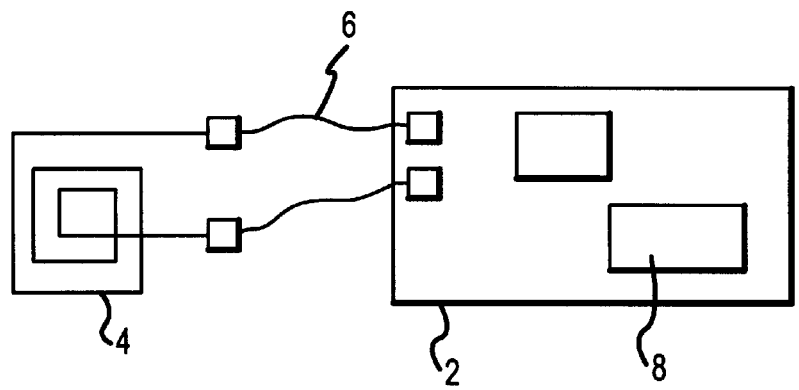
FIG. 1 is a schematic view of a typical prior art device.
Figure 2:
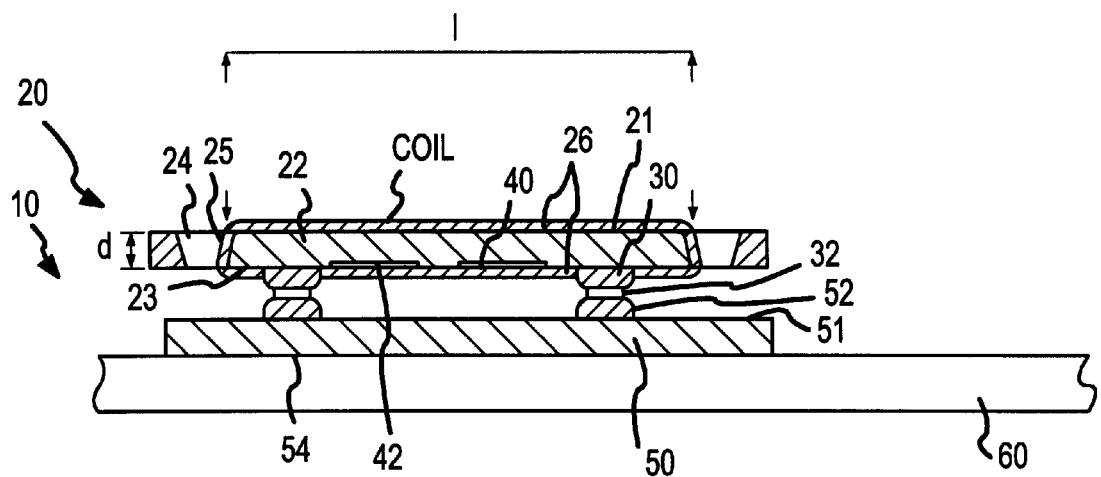
FIG. 2 is a sectional view of a two chip embodiment of the invention having a separate antenna chip and IC chip.
Figure 3:
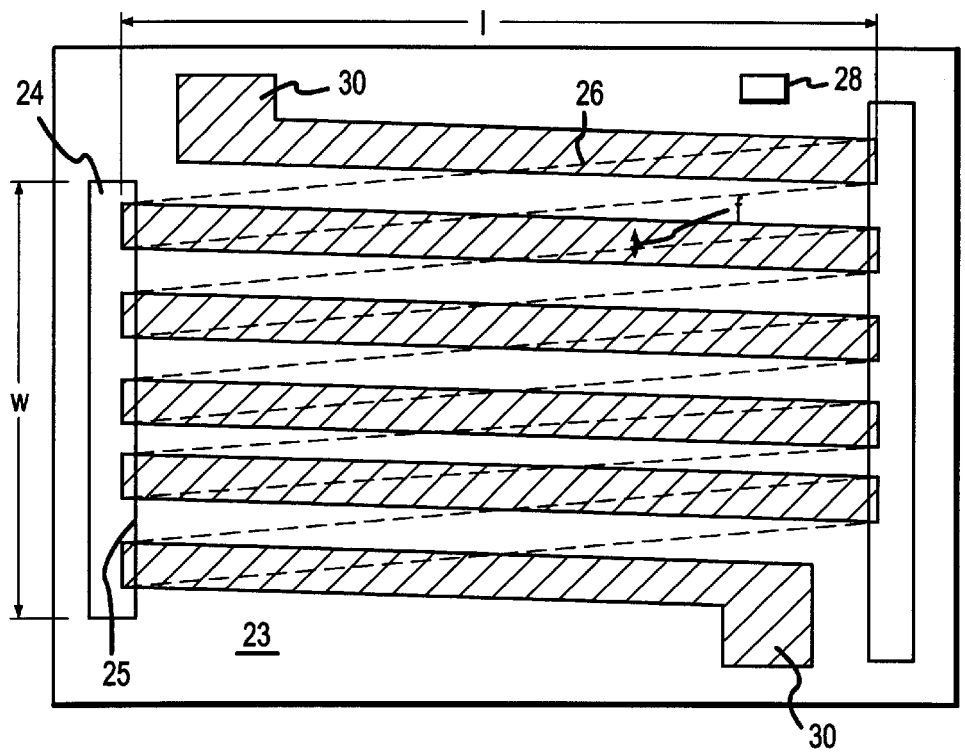
FIG. 3 is a plan view of the front side of an antenna chip according to the embodiment of FIG. 2.

An RFID device 10 according to the present invention is shown in a sectional elevation view in FIG. 2 and in a plan view in FIG. 3. The RFID device 10 has an antenna chip 20 electrically and mechanically interconnected to an IC (integrated circuit) 50. In the following description, all references of direction and dimension such as top, bottom, width, and length are only used for relative descriptions and do not necessarily correspond to any external reference frame.

Generally explaining the primary use of the present invention, the RFID device 10 is a transponder that together with an external reader allows for the monitoring of the location of the RFID device, and therefore for the monitoring and location of an article in which the RFID is attached or implanted. Further, the device includes memory and associated circuitry so that the external reader can read information from the device 10 and write information into the device 10. The external reader supplies an electromagnetic field that is sensed by the antenna chip 20. The external reader and/or the RFID device 10 may be connected to electrical and/or mechanical devices that perform a desired action depending upon the detected location of the RFID 10. It should be appreciated that the present invention has potential utility with any type of reader for any application that is now in use or may be developed in the future. It is contemplated that the RFID device 10 is passive; i.e., it does not include a power supply. A passive device is completely self contained and interacts with the exterior environment solely through RF energy, and is not electrically (i.e., via wire) connected to the exterior environment. The device 10 is mechanically engaged to the desired article. For example, it can be engaged by being glued to a substrate 60 as shown in FIG. 2, such as a PC board, a glass substrate, or any surface on or within the desired article. The RFID is preferably protected from the environment with a plastic covering or the like, such as by being encapsulated in a coating of liquid plastic that hardens in appropriate time and temperature conditions.

The present invention may also have application to an active system, where the device 10 would have an internal power source and electrical (wire or the like) connections to the exterior environment. While such an active system reduces the inherent simplicity and convenience of the device, it may have use in specialized applications.

The term "radio frequency" as used herein encompasses all frequencies of electromagnetic waves that can be sensed by an antenna and is not limited to specific frequencies.

The antenna chip 20 has a substrate core 22 having a chip width and a chip length that define the footprint of the antenna chip (the footprint being identical in area to the total area shown in the plan view of FIG. 3), and a depth d that defines the thickness of the chip 20 (as shown in the sectional elevation view of FIG. 2). As described in detail below, the chip 20 is effectively wound with conductive traces on both the chip front side and backside so that the traces from an effective coil having essentially the entire chip volume as a core.

Two elongate through-hole slots 24 penetrate the chip 20. Each slot 24 is an elongate trench that extends along the direction of the width of the chip 20. The slots 24 are parallel and are separated from one another by a distance 1. Each slot 24 has an elongate width w. A number of conductive traces 26 are deposited along the backside 21 of the chip 20 between the slots 24. The actual number of traces 26 shown in FIG. 3 is not necessarily representative of the number of traces in a specific implementation of the invention; representative numbers of traces are provided below.

As used herein, the "backside" 21 of the chip as used herein refers to side of the chip from which the slots 24 are etched; the opposite side of the chip is referred to as the "front side" 23. Each of the slots 24 have a side 25 that is coated with conductive material along a portion of the slot side 25 in contact with the traces 26. The chip front side 23 is similarly coated with conductive traces 26. The traces 26 on the chip front side 23 propagate at an angle with respect to the traces 26 on the chip backside 21 so that the combined chip front side traces 26 and chip backside traces 26 spiral around the chip core 22. Each individual trace on the chip backside 21 is in electrical communication with a trace on the chip front side 23 through a conductive coating on one of the sides 25. The sides 25 are insulating between the traces 26, so that each trace 26 on the chip backside is not in electrical contact with any other trace 26 on the backside except through a trace 26 on the chip front side. Thus, the traces 26 are configured to form an effective coil with the antenna chip core 22 being the coil core. It should be understood that, from another point of view, what have been described as conductive traces 26 is electrically one trace and could be referred to in the singular.

The antenna chip 20 is stacked in relation the IC 50. In this embodiment, the IC 50 is an integrated circuit chip having an integrated circuit formed thereon. The IC 50 has a top surface 51 supporting two electrical interconnect bumps 52. The traces 26 terminate at opposite corners on the chip front side 23 at a separate contact pad 30 of conductive material that is formed on the chip front side 23. It can be appreciated that one of the pads 30 corresponds to a "beginning" of the coil formed of the traces 26 and the other pad 30 corresponds to an "end" of the coil. The pads 30 could be positioned anywhere on the chip front side 23. Preferably, the antenna chip 20 and IC 50 have the same "footprint", although either could be larger or smaller than the other. The IC 50 has a bottom surface 54 that is in contact with the PC board substrate 60 (or other substrate surface), if such a substrate is present.

In manufacture, the antenna chip contact pads 30 are aligned with the IC bumps 52 and are physically and electrically joined via solder such as through reflow soldering (see solder paste 32 in FIG. 2), and the antenna chip 20 is stacked in relation to the IC 50 such as through use of a standard flip chip tool.

An optional component shown in FIG. 3 is a stabilizing contact pad 28 formed on the chip front side 23. The contact pad 28 connects to another stabilizing contact pad on the IC 50 to improve the mechanical connection between the antenna chip 20 and the IC 50. Additional contact pads or other similar mechanical joining means can be included if desired. A preferable cross sectional dimension of the contact pad 28 is between 20 and 50 microns, and the contact pad 28 is most preferably a square of about 25 by 25 microns.

The antenna chip 20 is preferably formed through wafer stacking processing techniques. Summarizing processing techniques known from other contexts, the slots 24 are formed by etching, such as by applying a mask to the chip backside 21 and etching the chip through voids in the mask. The voids are created by applying a photoresist layer over the mask, and etching the mask through the photoresist layer. Such etching generally results in the slots having a greater cross section at the chip backside 21 than at the chip front side 23, so that the coil is slightly trapezoidal (the variance in the cross section of the slots 24 being small compared to the distance l). The conductive traces penetrating the slot sides 25 are preferably produced by applying a polyimide such as "PROBIMIDE" to the slots, and selectively removing the polyimide to expose a seed layer for reception of a conductive trace. The traces are deposited on the chip by electroplating gold or other conductive material in the appropriate location.

An important aspect of the invention is that a wafer having multiple antenna chips formed thereon can be stacked and bonded with a wafer having multiple IC chips formed thereon. Thereafter, the stacked wafers are separated (diced) so that multiple RFID devices 10 are formed in a single batch processing step. This represents a significant advance over "one at a time" manufacturing techniques that have been employed to form antenna devices.

RFID 10 preferably includes one or more coupling capacitors formed thereon (sometimes referred to as storage capacitors) to power the device, and may also include one or more tuning capacitors. The antenna chip 20 preferably includes a tuning capacitor 40 electrically connected to the inductance formed by the traces 26, in order to provide a resonance frequency corresponding to the frequency of operation. This capacitor could instead be located on the IC 50. The tuning capacitor in general has a rather small capacitance, and can be constructed according to known techniques.

The antenna chip 20 will generally include an energy storing coupling capacitor 42 to power the IC (the energy being RF energy received from the reader). This coupling capacitor 42 could instead be formed on the IC 50. The capacitors 40, 42 are illustrated schematically in FIG. 2. It should be understood that the capacitors 40, 42 could be formed according to any capacitor known to the art.

The IC 50 can be any standard or custom integrated circuit. A representative and preferred type of IC 50 is a standard CMOS chip such as part no. V4050 from EM MICROELECTRONIC—MARIN SA of Switzerland for known RFID transponder devices.

Representative dimensions and materials are now disclosed, it being understood that the disclosure is for purposes of illustration and explanation, and not for limitation. The conductive traces are preferably of gold for minimal resistivity. A typical thickness of the traces 26 (i.e., direction corresponding to thickness d of the antenna chip 20) is about 20 micrometers. A typical width of the traces (i.e., direction corresponding to the elongate length w of the slots 24) is 10 micrometers (this width is referred to herein as feature size f). A typical thickness d of the antenna chip 20 is 500 micrometers. A typical distance l between the slots 24 is 3 mm. A typical elongate length w of the slots 24 is 2 mm.

The effective number of turns of the coil N is given by N=w/2f, assuming that the distance between traces 26 is equal to the feature size f. Using the above typical values, N=2,000 micrometers/2×10 micrometers=100 turns. The area of the coil A is given by A=d×l (neglecting the trapezoidal shape caused by the etching of the slots 24). Using the above values, A=600 micrometers×3 mm≈1.8 mm$^2$. The effective inductance of the coil (antenna chip 20) is given by the formula L=$\mu_o$×N$^2$×A/w. Substituting the typical values, L=10$\mu$H.

The Q factor of the antenna chip 20 is determined primarily by the resistance of the conductive traces 26, and the (eddy current) losses in the substrate core 22 of the antenna chip 20. The gold traces 26 having the dimensions given above have suitably low resistance. Using a high resistivity material for the substrate core 22, such as intrinsic silicon instead of non-intrinsic silicon as is normally used for an integrated circuit chip, minimizes losses, which are proportional to frequency and inversely proportional to resistivity. Hence the Q factor the antenna chip 20 is very high compared to the known art. Depending upon the application, material other than non-intrinsic silicon may also provide acceptable results.

Depending upon the application, it may be desirable to form the antenna chip with fewer turns N. The feature width f will then be correspondingly greater, resulting in lower resistance and hence better Q factor. The trade-off is reduced inductance L.

In a preferred embodiment of the invention, the footprint of the antenna chip 20 is equal to the footprint of the IC 50. The footprint of the antenna chip 20 is marginally greater than the area of w×l, as the slots 24 are relatively close to the exterior perimeter of the antenna chip 20. The thickness of the antenna chip 20 may be equal to the thickness of the IC 50. Thus, the resulting RFID device 10 has the identical footprint and twice the thickness of the IC 50. While having equal footprints provides for convenient packaging, it is not strictly necessary. It is also not necessary for the antenna chip 20 to have the same thickness as the IC 50. For example, a standard six inch Si wafer may be 625 microns during initial wafer fabrication, and may be thinned to about 400 microns after processing according to the invention is completed. The antenna chip 20 could be either thicker (to provide larger inductance) or thinner (to reduce the total thickness) depending upon the application.

Figure 9:
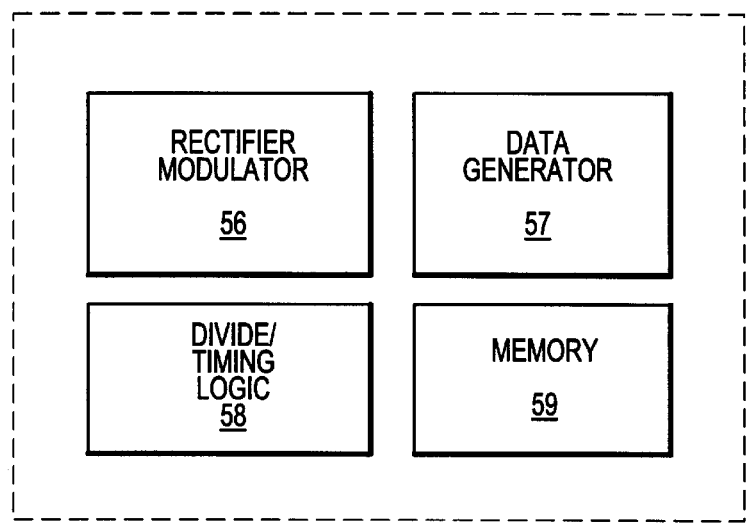
FIG. 9 is a schematic of the functional circuitry of the IC of FIG. 2 or any alternative embodiment.

A functional schematic diagram of the IC 50 circuitry is shown in FIG. 9 and described blow. At the most elemental level, the IC 50 circuitry includes at least some electronic memory and/or electronic logic. The electronic implementation of the circuitry can take a number of forms as is known in the art in the context of present RFID devices. The IC 50 includes a rectifier and balanced modulator 56, a data generator 57, a divide/timing logic module 58, and a memory module 59. The antenna chip 20 receives an interrogation signal from the reader (which may also be referred to as a controller/interrogator unit), and transfers the received signal to the IC 50. The received signal is rectified and charges the storage capacitor 42 which then powers the circuit. The divide/timing logic module 58 extracts information from the received signal, processes the information in any desired manner via the data generator 57, and stores results in the memory module 59. In a representative application, a unique code word (identification code) and any other data in the IC 50 is mixed with the received signal and transmitted through the antenna chip 20 to the reader. In this way, any desired information can be transferred between the RFID 10 and the reader. It will be obvious to those skilled in the art that the IC 50 can include any electronics that are currently formed on integrated circuits, and as the field of electronics advances it will be understood that the present invention may have utility with future generation electronics.

Single Chip Solution

Figure 4:
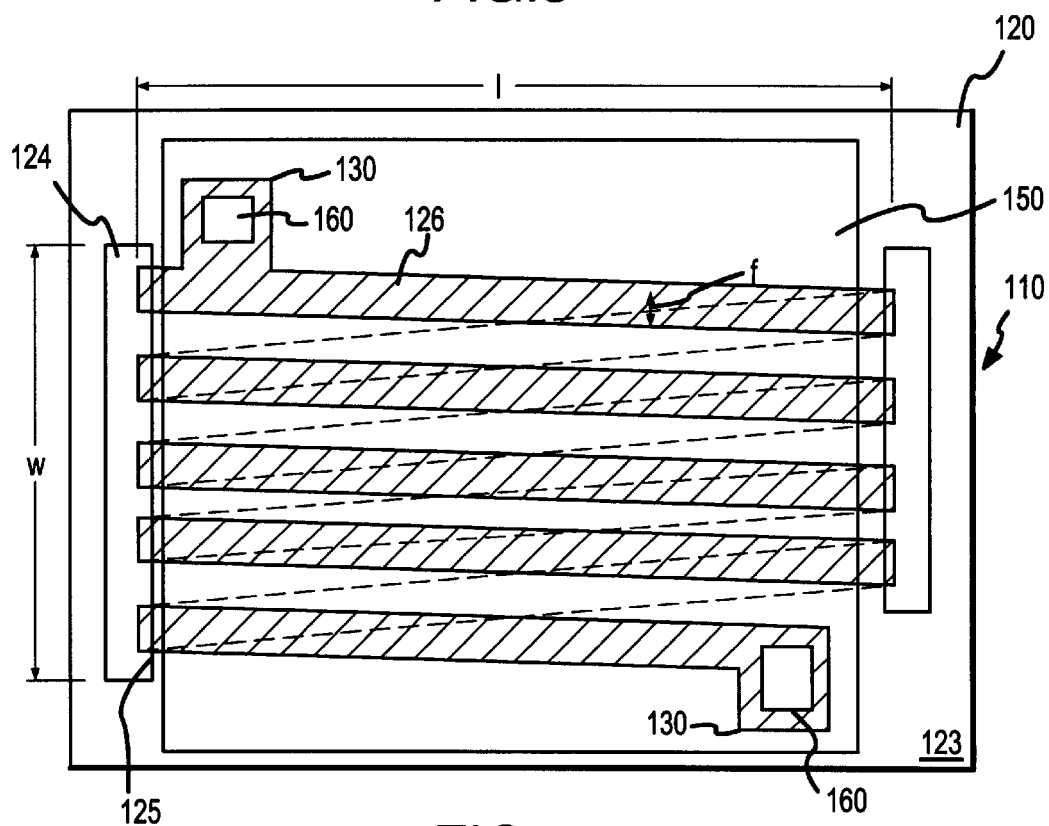
FIG. 4 is a plan view of the front side of a one chip embodiment of the invention showing an RFID chip having an antenna formed thereon.

Referring now to the plan view of FIG. 4, another embodiment of the invention is described. In this embodiment, reference numerals have "100" added to the reference numerals that generally correspond to similar components of the above-described embodiment—this is done for convenience of reference and is not intended to limit the scope of either embodiment of the invention in any way. Some numerals in the "one hundred" series do not have corresponding parts in the previously described embodiment and vice versa.

FIG. 4 is a plan view of a front side 123 of an RFID device 110. The RFID device 110 includes an RFID chip 120 having an antenna and an IC 150 formed thereon. Thus, an RFID device 110 is formed on a single chip.

Two through-hole slots 124 having an elongate length w and a separation distance l penetrate the RFID chip 120. Conductive traces 126 having a feature width f span the chip front side 123, and also the chip backside as shown in phantom. The conductive traces 126 on the front side 123 connect to the traces 126 on the chip backside through conductive material deposited on a side 125 of each of the slots 124. The conductive traces propagate to form a coil that spirals around the front side and backside of the RFID chip 120 so that essentially the entire chip 120 volume forms a core, thus providing an inductance as explained above. (Of course, the area of the chip 120 that is between the slots 124 does not act as a core.) The traces 126 terminate in two contact pads 130 on the chip front side 123. In this respect the antenna chip 120 is similar to the antenna chip 20, and further detail as to structure and representative configurations may be found above.

The RFID device 110 includes the antenna conductive traces 126 as an integral part of the RFID chip 120, and also includes the IC 150 on the RFID chip. In a preferred embodiment, the IC 150 is formed on the chip front side 123, between the slots 124, and beneath the traces 126. (By "beneath", it is meant that the IC is towards the chip backside as compared to the traces 126 on the chip front side 123.) An insulator separates the conductive traces 126 from the IC 150. The insulator can be, and preferably is, the standard passivation layer of a processed chip. The IC 150 has a footprint that is preferably limited by the dimension "l", as the IC area is between the slots 124. The IC 150 can have any dimension in the "w" direction up to the maximum dimension of the chip 120. Most preferably, the contact pads 130 are within an area of the RFID chip 120 coinciding with the footprint of the IC 50 so that electrical interconnections can conveniently be made therebetween. In particular, the contact pads 130 electrically interconnect with bond pads 160 of the IC 150.

As with the two chip embodiment, the single chip solution is most preferably formed in a batch processing operation, where multiple RFID devices are formed on a wafer, and the wafer is thereafter diced.

Deposited Permalloy Layer in Groove

Figure 5A:
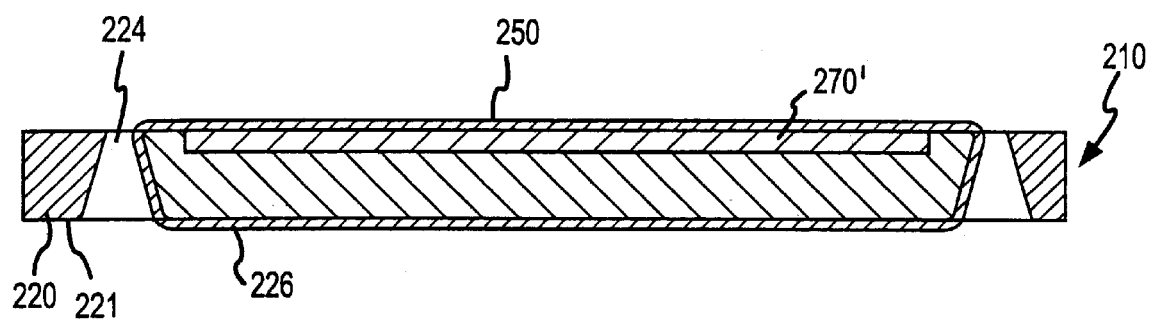
FIG. 5A is a sectional view of an embodiment similar to that of FIG. 4, having a permalloy layer situated within a groove on the front side of the RFID chip.
Figure 5:
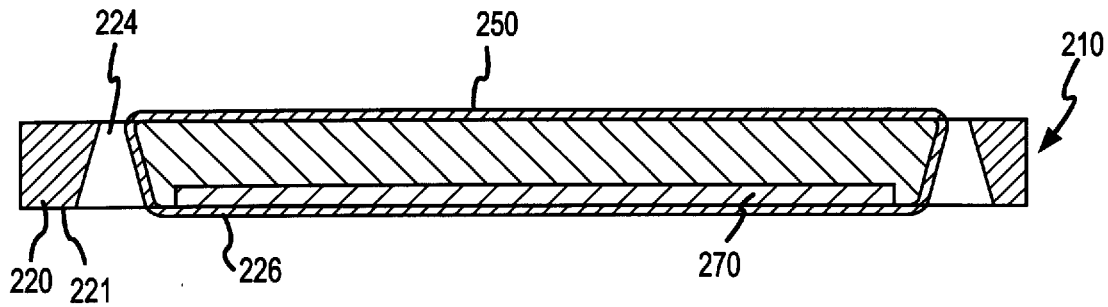
FIG. 5 is a sectional view of an embodiment similar to that of FIG. 4, having a permalloy layer situated within a groove on the backside of the RFID chip.

Another aspect of the invention is shown in the sectional view of FIG. 5. This embodiment is generally similar to the above described embodiment, and reference characters have "100" added to them so that a "two hundred" series results. An RFID device 210 has two through-hole slots 224 and conductive traces 226 that form an operative coil on an RFID chip 220. An IC 250 serves a comparable function as the IC 150.

A relatively high magnetic permeability material such as permalloy is formed within the antenna chip 220. Such material forms a permalloy layer 270 that is surrounded by the traces 226, so that the permalloy layer 270 is in effect at least a part of the core for the coil formed by the traces 226. The cross sectional area of the layer 270 may be nearly equivalent to that of the combined traces 226—and is only incrementally smaller since it is bounded by the traces. The thickness (i.e., direction extending between chip backside 221 and front side 223) of the layer 270 is not limited to any particular dimension, but is preferably on the order of tens of microns. A representative thickness of the permalloy layer is about 50 microns.

The permalloy layer may be formed by etching a groove on the RFID chip (preferably of silicon) backside 221. As used in this context, a "groove" is any depression and is not limited to a particular shape or configuration. The groove etching can be performed before or after the slots 224 are etched, most preferably before. Exemplary process steps are: applying a photoresist layer to the chip backside 221; exposing the photoresist by applying a groove mask; etching a groove; removing the photoresist; depositing the permalloy layer 270 within the groove through evaporation, sputtering, or other physical vapor deposition process or chemical vapor deposition process; and removing any permalloy deposited outside of the groove by chemical mechanical polishing (CMP), such as in a damascene process.

The inclusion of the permalloy layer 270 results in a larger inductance of the coil as compared to the above-described embodiment, as the inductance is proportional to the magnetic permeability.

As used herein, permalloy can be any relatively high magnetic permeability material and is not limited to a specific chemical compound. The relation of the material is to silicon, so that relatively high permeability refers to, for example, at least ten times higher permeability than that of silicon. Such material is generally, but not necessarily, a ferrite compound.

It should be noted that the above processing features of this embodiment of the present invention are easily accomplished, as backside processing is performed to etch the slots 224. In connection with the etching of the slots 224, forming additional structures may be conveniently accomplished. While it is most likely preferable to form the permalloy groove in the back side, it may in some cases be desirable to deposit the groove in the chip front side and that is also a feature of the invention. FIG. 5A, showing permalloy layer 270'.

Thin Film Deposited Permalloy Layer

Figure 6:
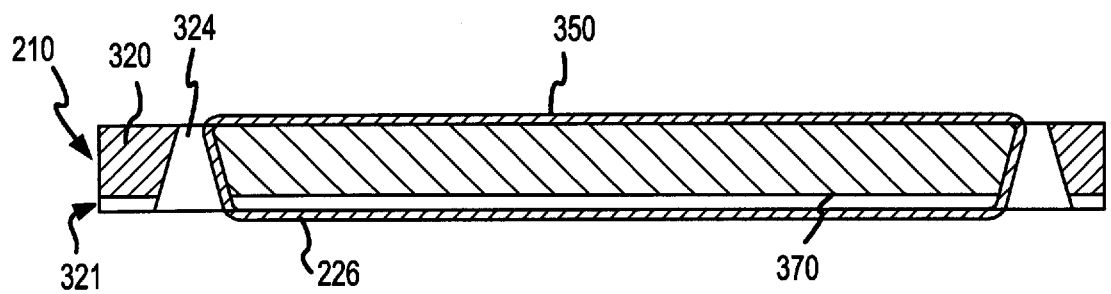
FIG. 6 is a sectional view of an embodiment similar to that of FIG. 5, having a deposited permalloy layer on the backside of the RFID chip.

Another aspect of the invention is shown in the sectional view of FIG. 6. This embodiment is generally similar to the above described embodiment, and reference characters have "100" added to them so that a "three hundred" series results. An RFID device 310 has two through-hole slots 324 and conductive traces 326 that form an operative coil on an RFID chip 320. An IC 350 serves a comparable function as the IC 250. A permalloy layer 370 is formed on the RFID chip backside 321 for the identical purpose as in the two hundred series. In this embodiment, the permalloy layer 370 is deposited by evaporation or similar technique. Preferably, the deposition step occurs after thinning the RFID chip to a desired thickness such as about 400 microns, and before the slots 324 are etched. The slots are then etched through the permalloy layer 370. Preferably, the thickness of the layer 370 is about several thousand Angstroms.

The three hundred series is advantageous compared to the two hundred series in that no additional mask layers are required, and the processing is thus straightforward and inexpensive. The two hundred series is advantageous in that a thicker permalloy layer and hence greater inductances can be more readily achieved. The specific implementation can be selected based upon the required inductance, and allowable manufacturing costs.

Capacitor Formed on Chip Backside

Figure 7:
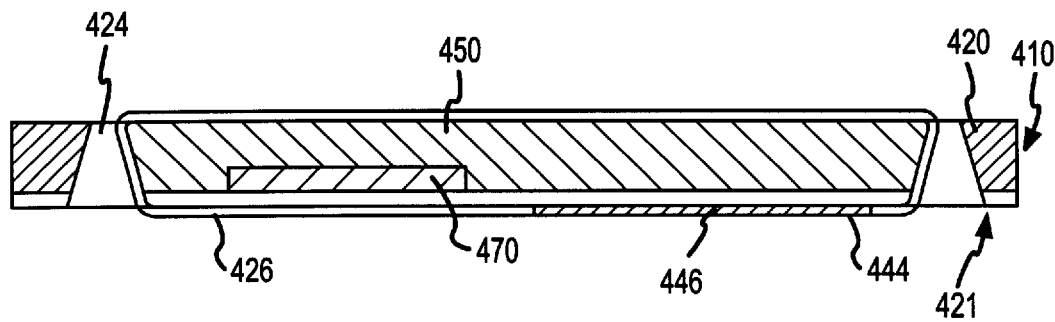
FIG. 7 is a sectional view of an embodiment similar to that of FIGS. 5 and 6, having a permalloy layer and a capacitor on the backside of the RFID chip.

Another aspect of the invention is shown in the sectional view of FIG. 7. This embodiment is generally similar to the above described embodiment, and reference characters have "100" added to them so that a "four hundred" series results. An RFID device 410 has two through-hole slots 424 and conductive traces 426 that form an operative coil on an antenna chip 420. An IC 450 serves a comparable function as the IC 350.

This embodiment has a permalloy layer 470 formed on a portion of the chip backside 421. The permalloy layer 470 can be deposited according to the two hundred series embodiment described above. Of course, a groove etched to contain the permalloy layer 470 would only occupy the desired portion of the chip backside 421.

Further deposited on the chip backside 421 is a coupling capacitor having a coupling capacitor dielectric 446. In this embodiment and all embodiments, it should be understood that the described capacitor is preferably intended to be a coupling capacitor unless otherwise noted. However, if desired, the techniques can also be used to form a tuning capacitor, and that is an aspect of the invention. In a preferred implementation, one capacitor electrode is an etched or deposited layer 444, this electrode being towards the backside 421 with respect to the dielectric 446. The other capacitor electrode is the silicon substrate of which the RFID 420 is primarily formed. In an alternative embodiment, the capacitor dielectric 446 is sandwiched between two etched or deposited electrodes.

The coupling capacitor is formed on a different area of the chip backside 421 from the permalloy layer 470. In a representative embodiment, the permalloy layer may occupy about ½ of the chip backside 421 area between the slots 424 and the capacitor may occupy about the other ½ of the chip backside 421 area between the slots 424.

The capacitor is formed by suitable deposition techniques, as are known in the art. The capacitor electrode 444 is in electrical communication with the IC 450 and the traces 426 so that the capacitor may be charged from the reader field and power the IC.

While the smaller permalloy layer 470 (as compared with the permalloy layer 270) reduces the inductance of the antenna chip 420, it is advantageous in that a capacitance can be formed relatively easily as the backside of the chip 421 is already processed in the etching of the slots 424, and the additional step of forming the capacitor can be conveniently accommodated.

Capacitor Formed on Chip Front Side

Figure 8:
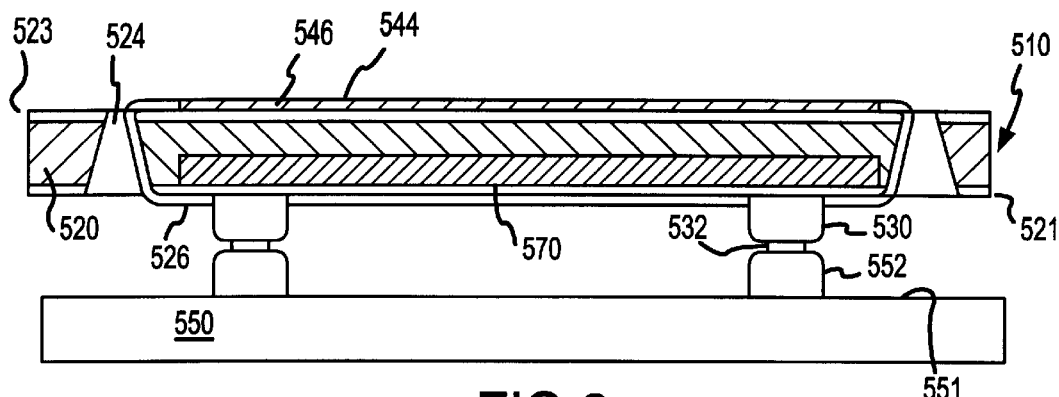
FIG. 8 is a sectional view of an embodiment of the invention similar to that of FIG. 2, showing an IC chip and a separate antenna chip having a permalloy layer and a capacitor on opposite sides of the antenna chip.

Another aspect of the invention is shown in the sectional view of FIG. 8. This embodiment is generally similar to the embodiment of FIG. 2 (two chip solution), and reference characters have "500" added to them so that a "five hundred" series results. An RFID antenna chip 520 has two through-hole slots 524 and conductive traces 526 that form an operative coil on an antenna chip 520. An RFID IC chip 550 serves a comparable function as the IC 50.

A permalloy layer 570 is formed on the chip backside 521 that is generally equivalent to the permalloy layer 270. Alternatively, the permalloy layer could be deposited as described in the three hundred series.

A coupling capacitor having a coupling capacitor dielectric 546 is formed on the chip front side 523. In a preferred implementation, one capacitor electrode 544 is an etched or deposited layer, this electrode being towards the front side 523 with respect to the dielectric 546. The other capacitor electrode is the silicon substrate of which the RFID chip 520 is primarily formed. In an alternative embodiment, the capacitor dielectric 546 is sandwiched between two etched or deposited electrodes. The capacitor is electrically engaged with the IC 550 and with the traces 526, through appropriate electrical interconnections.

The capacitor electrode 544 and dielectric 546 are deposited on the chip front side 523 before the traces 526 are deposited, in a deposition step as is known in the art.

An advantage of this embodiment is that the permalloy layer 570 can extend over the entire chip backside 521, and thus further raise the inductance of the antenna chip as compared with, for example, the four hundred series, while still allowing for capacitor formation on the chip 520.

The RFID IC chip 550 is attached to the antenna chip 520 similarly as the embodiment of FIG. 2. In particular preferred embodiment, the antenna chip has contact pads 530 that correspond to the beginning and end of the coil formed of the traces 526. The contact pads 530 are attached to IC chip bumps 552 through solder 532. An additional stabilizing contact pad can be used to improve the mechanical connection.

It should be understood that in the two chip solutions as shown in FIG. 2 and FIG. 8, the antenna chip could be reversed in orientation so that the front side is attached to the IC chip. It should also be understood that there is a great deal of flexibility in positioning a permalloy layer and one or more capacitors on the antenna chip. Any permalloy layer or capacitor could be positioned on either side of the antenna chip.

While the present invention has been described in the context of an RFID device, it will be appreciated by those skilled in the art that the disclosed method of forming a coil on both sides of a substrate chip so that the coil encloses the volume of a chip can form a desired inductance useful in many applications. Representative examples of electronic circuits that may benefit from an inductance formed according to the above disclosure are oscillators and filters; of course a chip-formed inductance may be useful in an almost limitless number of circuits.

As described above, an RFID device is provided having a coil formed on a chip, which can greatly reduce the cost of the device and ensure reliability. A number of teachings are disclosed to further the utility of the device. In light of the above description, it will be apparent to those skilled in the art that the invention can be practiced through other embodiments than are specifically set forth. For example, the dimensions and/or shape of the antenna chip may be varied. As another example, different materials could be used. It should also be apparent that some of the features can be utilized without using all of the features that are described. Accordingly, the invention is to be interpreted in light of the claims and their equivalents.

What is claimed is:

1. A Radio Frequency Identification (RFID) device comprising:
   an antenna chip having a chip core, a chip front side, a chip backside, and conductive traces on the chip front side and chip backside, at least some of the traces on the chip front side being in electrical communication with at least some of the traces on the chip backside so that the conductive traces form an operative coil around the chip core;
   an integrated circuit chip having an integrated circuit formed thereon, the integrated circuit having at least one of electronic memory and logic, integrated circuit being in electrical communication with the coil;
   the integrated circuit chip being stacked in relation to the antenna chip and being mechanically attached thereto.

2. The RFID device of claim 1, wherein the antenna chip has two elongate through-hole slots, and some of the traces on the chip front side are connected to some of the traces on the chip backside through conductive material deposited on a portion of the slots.

3. The RFID device of claim 2, wherein:
   the integrated circuit chip has electrical interconnect bumps electrically communicating with the integrated circuit;
   the antenna chip has at least two contact pads, the at least two contact pads being electrically attached to some of the conductive traces so that one contact pad is electrically connected to a beginning of the coil and one contact pad is electrically connected to an end of the coil; and
   the beginning and ending contact pads are mechanically and electrically connected to the interconnect bumps.

4. The RFID device of claim 3, further comprising stabilizing means for mechanically connecting the antenna chip and the integrated circuit chip in addition to the contact pads and interconnect bumps.

5. The RFID device of claim 4, wherein the stabilizing means comprise an antenna chip stabilizing contact pad and an integrated circuit chip stabilizing contact pad connected to the antenna chip contact pad.

6. The RFID device of claim 2, wherein the antenna chip includes a high magnetic permeability layer therewithin, such that the high magnetic permeability layer forms at least part of a core for the coil.

7. The RFID device of claim 6, wherein the high magnetic permeability layer is formed on the antenna chip backside.

8. The RFID device of claim 6, wherein the high magnetic permeability layer is formed on the antenna chip front side.

9. The RFID device of claim 2, further comprising a capacitor formed on the antenna chip.

10. The RFID device of claim 9, wherein the capacitor is a coupling capacitor for providing power to the integrated circuit.

11. The RFID device of claim 9, wherein the capacitor is a tuning capacitor.

12. The RFID device of claim 9, further comprising an additional capacitor formed on the antenna chip, one capacitor being a coupling capacitor and the other capacitor being a tuning capacitor.

13. The RFID device of claim 2, wherein the antenna chip is formed of intrinsic silicon.

14. A Radio Frequency Identification (RFID) device comprising:
   an RFID chip having a chip core, a chip front side, a chip backside, and conductive traces on the chip front side and chip backside, some of the traces on the chip front side being in electrical contact with some of the traces on the chip backside so that the conductive traces form a coil around the chip core; and
   an integrated circuit formed on the chip front side, the integrated circuit having at least one of electronic memory and logic, the integrated circuit being in electrical communication with the coil.

15. The RFID device of claim 14, wherein the chip has two elongate through-hole slots, and some of the traces on the chip front side are connected to some of the traces on the chip backside through conductive material deposited on a portion of the slots.

16. The RFID device of claim 15, wherein the chip has two contact pads formed on the chip front side, one of the contact pads being in electrical communication with at least one of the traces and the other contact pad being in electrical communication with at least another of the traces so that the one contact pad corresponds to a beginning of the coil and the other contact pad corresponds to an end of the coil; and the integrated circuit has at least two bond pads, one bond pad being electrically connected to one of the contact pads and the other bond pad being electrically connected to the other contact pad.

17. The RFID device of claim 15, wherein the chip includes a high magnetic permeability layer therewithin, such that the high magnetic permeability layer forms at least part of a core for the coil.

18. The RFID device of claim 17, wherein the high magnetic permeability layer is disposed within a groove formed on the chip backside.

19. The RFID device of claim 17, wherein the high magnetic permeability layer is deposited in a damascene process.

20. The RFID device of claim 17, wherein the high magnetic permeability layer is deposited by physical vapor deposition.

21. The RFID device of claim 15, further comprising a capacitor formed on the chip.

22. The RFID device of claim 21, wherein the capacitor is a coupling capacitor for providing power to the integrated circuit.

23. The RFID device of claim 21, wherein the capacitor is a tuning capacitor.

24. The RFID device of claim 21, further comprising an additional capacitor on the chip, one capacitor being a coupling capacitor and the other capacitor being a tuning capacitor.

25. The RFID device of claim 15, further comprising a capacitor and a high magnetic permeability layer formed on the chip.

26. The RFID device of claim 25, wherein the capacitor and the high magnetic permeability layer are formed on the same chip side.

27. The RFID device of claim 26, wherein the capacitor and the high magnetic permeability layer are formed on the chip front side.

28. The RFID device of claim 26, wherein the capacitor and the high magnetic permeability layer are formed on the chip backside.

29. The RFID device of claim 25, wherein the capacitor and the high magnetic permeability layer are formed on opposite sides of the chip.

* * * * *